United States Patent
Weng

(10) Patent No.: US 6,978,415 B1
(45) Date of Patent: Dec. 20, 2005

(54) VARIABLE REDUNDANCY CYCLIC CODE ENCODERS

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 576 days.

(21) Appl. No.: 09/996,252

(22) Filed: Nov. 27, 2001

(51) Int. Cl.[7] .................................... H03M 13/00
(52) U.S. Cl. ................ 714/781; 708/492; 714/785
(58) Field of Search .................. 714/781, 752, 714/756, 757, 758, 761, 762, 763, 769, 774, 784, 785, 748, 807; 708/492

(56) References Cited

U.S. PATENT DOCUMENTS

| | | | | |
|---|---|---|---|---|
| 5,140,596 A | * | 8/1992 | Weldon, Jr. ................. | 714/762 |
| 5,185,711 A | * | 2/1993 | Hattori ....................... | 708/492 |
| 5,280,488 A | * | 1/1994 | Glover et al. ............... | 714/784 |
| 5,331,645 A | | 7/1994 | Miller et al. ................ | 714/785 |
| 5,379,305 A | | 1/1995 | Weng ......................... | 714/774 |
| 5,444,719 A | | 8/1995 | Cox et al. ................... | 714/769 |
| 5,757,826 A | | 5/1998 | Fredrickson ................ | 714/784 |
| 5,768,296 A | | 6/1998 | Langer et al. .............. | 714/784 |
| 5,901,158 A | | 5/1999 | Weng et al. ................ | 714/785 |
| 5,912,905 A | | 6/1999 | Sakai et al. ................. | 714/784 |
| 5,935,269 A | * | 8/1999 | Kodama et al. ............ | 714/781 |
| 6,259,749 B1 | * | 7/2001 | Andoh ....................... | 375/341 |

OTHER PUBLICATIONS

G. Fettweis, M. Hassner, "A Combined Reed–Solomon Encoder and Syndrome Generator with Small Hardware Complexity", IBM Almaden Research Center, San Jose, CA, pp. 1871–1874.

* cited by examiner

Primary Examiner—Guy J. Lamarre
(74) Attorney, Agent, or Firm—Cesari and McKenna, LLP

(57) ABSTRACT

A multiple-stage encoder encodes the data in accordance with one, two, . . . , or f factors of an associated cyclic code generator polynomial $g(x)=g_1(x)*g_2(x)* \ldots *g_f(x)$ to produce data code words that include a selected number of ECC symbols. The encoder encodes the data $d(x)$ in a first stage using a first factor $g_m(x)$ of a selected polynomial $p_s(x)$ to produce $d(x)*x^s = q_1(x)g_1(x)+r_1(x)$, where $q_1(x)$ is a quotient and $r_1(x)$ is a remainder and $g_1(x)$ has degree s. In a next stage the encoder encodes $q_1(x)$ using a next factor $g_m(x)$ of the selected polynomial to produce $q_m(x)=q_1(x)g_m(x)+r_m(x)$ and so forth, until the remainders associated with all of the factors of the selected generator polynomial have been produced. The system then manipulates the remainders to produce a remainder $r_s(x)$ that is associated with the selected polynomial $p_s(x)$, and uses a cyclically shifted version of the remainder $r_s(x)$ as the code word ECC symbols. The same circuitry is used to both produce and manipulate the remainders, and may also be used for decoding the code words in accordance with the selected polynomials.

20 Claims, 4 Drawing Sheets

VARIABLE REDUNDANCY CYCLIC CODE ENCODERS

BACKGROUND OF THE INVENTION

1. Field of the Invention

The invention relates generally to error correction systems and, more particularly, to systems that use selected numbers of redundancy symbols.

2. Background Information

Data stored on magnetic media, such as magnetic disks, are typically stored in encoded form, so that errors in the stored data can possibly be corrected. The errors may occur, for example, because of inter-symbol interference, a defect in the disk, or noise. If more errors are likely, and the system is thus required to correct greater numbers of errors, more error correction information in the form of redundancy symbols is required to be stored on the disk. Some of the trade-offs for including increased error correction information on the disk are the extra time associated with encoding and decoding the data and the complexity of the encoding and decoding systems.

Encoders for encoding data in accordance with cyclic error correction codes ("ECCs") to produce the redundancy, or ECC, symbols are well known. An encoder that encodes the data using a given ECC manipulates the data symbols in accordance with the corresponding generator polynomial. A conventional encoder that encodes data in accordance with an ECC that produces "j" ECC symbols includes j Galois Field multipliers. The Galois Field multipliers are associated, respectively, with the j coefficients of the corresponding generator polynomial, g(x). The encoder also includes j adders that combine the products associated with a given data symbol with the results of the encoding of the previous data symbol, and j registers that hold the sums produced by the adders. At the end of the encoding, the j registers contain the j ECC symbols.

Alternatively, the data may be encoded to produce the j ECC symbols using a circuit that includes, in addition to the j Galois Field multipliers, registers and adders, a chain of j feedback adders, as discussed in an article by Gerhard Fettweis and Martin Hassner entitled *A Combined Reed-Solomon Encoder And Syndrome Generator With Small Hardware Complexity*, published by IEEE in 1992. Such a circuit, referred to as a Fettweis-Hassner encoder/syndrome combination circuit, is used in systems in which the same Galois Field multipliers are used for both encoding and syndrome generation. The Fettweis-Hassner encoder/syndrome computation circuit, with its j Galois Field multipliers similarly produces j ECC symbols. However, as discussed in the article, the encoding is associated with a latency that is attributable to the delay through the chain of j feedback adders.

A conventional data processing system uses a selected encoder to encode n-j data symbols in accordance with the generator polynomial g(x) and produce the j ECC symbols that are to be combined with the data into n-symbol ECC code words. When a given data code word is later retrieved from the disk, the system uses the j ECC symbols to correct up to j/2 errors in the code word.

For certain media, however, ECCs that are capable of correcting more or fewer errors may be used to protect the data. For example, the media manufacturing process may produce media of varying quality. The media that meets the most stringent quality standards may require less error protection, and thus, require fewer ECC symbols. In contrast, the media that does not meet the same quality standards requires greater error protection and thus more ECC symbols.

Known prior systems use complex and/or time consuming encoding/decoding systems to produce the code words with different numbers of ECC symbols. One such system includes a plurality of encoders, each associated with a different generator polynomial. A user then selects which encoder to use to produce the required number of ECC symbols. The system may instead use a complicated encoding/decoding scheme in which the user essentially deletes selected ECC symbols after encoding. This system uses a single encoder. However, when the data and the retained ECC symbols are later decoded, the system must use a relatively complex and time consuming error-and-erasure decoding scheme to perform error-only decoding.

If the Fettweis-Hassner encoder/syndrome combination circuit is used, the user may disable certain stages of the circuit, to select corresponding numbers of ECC symbols. The same stages are then used for syndrome generation during decoding. Such a system works well for ECCs that include relatively small numbers of ECC symbols, however, the delay associated with the feedback adder chain effectively prohibits the use of the circuit for codes with relatively large numbers of ECC symbols.

Accordingly, what is needed is a less complex and/or time consuming encoding and decoding system that encodes the data to produce a desired number of ECC symbols, and decodes the data and ECC symbols using error-only decoding.

SUMMARY OF THE INVENTION

An encoder encodes the data in accordance with a selected number of factors of a cyclic code generator polynomial $g(x)=g_1(x)*g_2(x)* \ldots *g_j(x)$ to produce data code words that include a corresponding number of ECC symbols. The code words are thus produced by encoding the data in accordance with one of the polynomials:

$$p_1(x)=g(x)=g_1(x)*g_2(x)* \ldots *g_j(x)$$

$$p_2(x)=g_2(x)*g_3(x)* \ldots *g_j(x)$$

$$\ldots$$

$$p_j(x)=g_j(x)$$

$$p_{j+1}(x)=g_1(x)*g_2(x)g_3(x)* \ldots *g_{j-1}(x)$$

$$p_m=g_1(x)$$

The encoder has multiple stages, and at least a first stage of the encoder corresponds to encoding by a factor $g_i(x)$ that is associated with a relatively large number of ECC symbols. The first stage is constructed to encode the data without significant delay, while other stages may be associated with longer delays but allow a greater selection of associated numbers of ECC symbols, as discussed below.

The system uses the same circuitry to decode the code word in accordance with the particular polynomial selected to encode the data. Further, the system produces error syndromes and performs error location and correction operations in a conventional manner.

Briefly, the system produces a code word with a particular number of ECC symbols using, for example, a selected polynomial $p_i(x)=g_1(x)*g_2(x)* \ldots *g_i(x)$ by first encoding the data d(x) in a first stage using the factor $g_1(x)$ to produce $$d(x)*x^s=q_1(x)g_1(x)+r_1(x),$$

where $q_1(x)$ is a quotient and $r_1(x)$ is a remainder and $g_1(x)$ has degree s. In a next stage the encoder encodes $q_1(x)$ using the next factor of the selected generator polynomial, in the example, $g_2(x)$, to produce $$q_1(x)=q_2(x)g_2(x)+r_2(x)$$

and so forth, until the remainders associated with all of the factors of the selected generator polynomial have been produced. The system then manipulates the remainders associated with the factors to produce a remainder $r_t(x)$ that is associated with the selected polynomial, $p_t(x)$, and uses a cyclically shifted version of the remainder $r_t(x)$ as the code word ECC symbols.

As discussed in more detail below, the same circuitry is used to both produce and manipulate the remainders.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
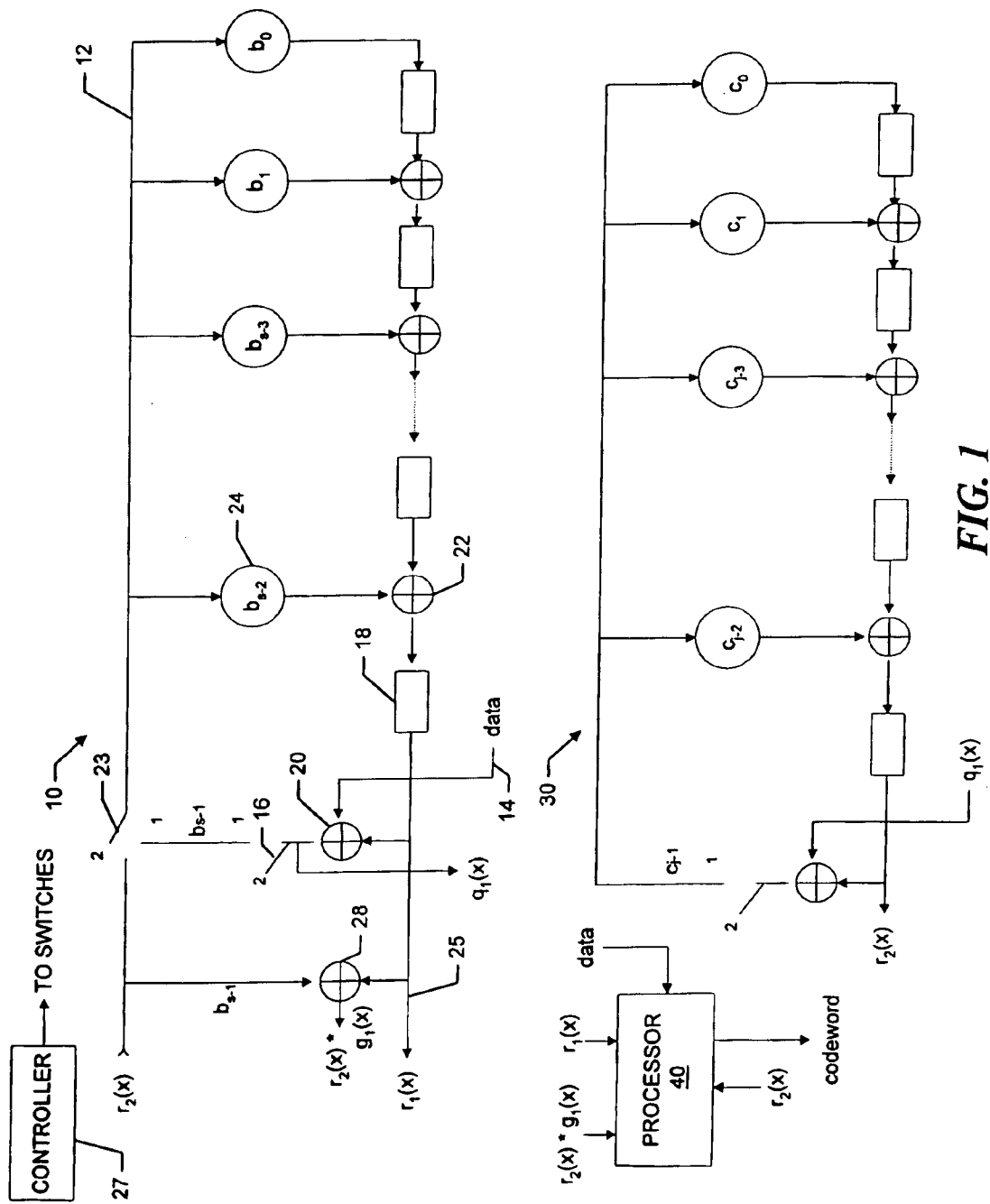
FIG. 1 is a functional block diagram of an encoder constructed in accordance with the invention.

The discussion below is separated into sections, a first section discusses the mathematical theory, a second discusses one embodiment of the encoder and a third section discusses another embodiment of the encoder. All mathematical operations are is Galois Field operations.

A. The Theory

The k data symbols to be encoded may be represented as the coefficients of a degree k−1 polynomial $d(x)$. The ECC is a cyclic code with a generator polynomial $g(x)$ of degree n−k, and the data is encoded by dividing it by the generator polynomial. The result is a quotient $q(x)$ of degree n−(n−k)−1=k−1 and a remainder $r(x)$ of at most degree n−k−1. The coefficients of the remainder $r(x)$ are included in the code word as the n−k ECC symbols. The code word data is thus:

$$d(x)*x^{n-k}=q(x)*g(x)+r(x) \qquad \text{eqn. 1}$$

where $x^{n-k}$ represents a shifting of the data to the appropriate position in the code word.

For a generator polynomial with two factors:

$$g(x)=g_1(x)*g_2(x)$$

where $g_1(x)$ has degree s and $g2(x)$ has degree n−k−s, the data may be encoded by first dividing the data by the factor $g_1(x)$ and then further dividing the result by the factor $g_2(x)$. When dividing by $g_1(x)$, the data is shifted by $x^s$, that is, by the degree of $g_1(x)$:

$$d(x)*x^s=q_1(x)*g_1(x)+r_1(x) \qquad \text{eqn. 2}$$

where the quotient $q_1(x)$ has degree k−1+s−s=k−1 and the remainder $r_1(x)$ has at most degree s−k−1. The quotient $q_1(x)$ is then divided by the remaining factor $g_2(x)$ to produce:

$$q_1(x)=q_2(x)*g_2+r_2(x) \qquad \text{eqn. 3}$$

where the degree of $q_2(x)$ is k−1−(n−k−s)=2k−1−n+s, that is, the degree of $q_1(x)$ minus the degree of $g_2(x)$. Substituting eqn. 3 into the eqn. 2:

$$d(x)*x^s = (q_2(x)*g_2 + r_2(x))*g_1(x) + r_1(x) \qquad \text{eqn. 4}$$
$$= q_2(x)*g_2*g_1 + r_2(x)*g_1(x) + r_1(x).$$

Multiplying both sides of eqn. 4 by $x^{n-k-s}$, the code word data is:

$$d(x)*x^s*x^{n-k-s} = d(x)*x^{n-k} \qquad \text{eqn. 5}$$
$$= (q_2(x)*g_2*g_1 + r_2(x)*g_1(x))*x^{n-k-s} +$$
$$r_1(x)*x^{n-k-s}$$
$$= q_2(x)*g_2*g_1*x^{n-k-s} + r_2(x)*g_1(x)*x^{n-k-s} +$$
$$r_1(x)^{n-k-s}$$

where the degree of $q_2(x)*x^{n-k-s}$ is 2k−1−n+s+n−k−2=k−1. According to the uniqueness property of the Euclidean division theorem, the remainder of eqn. 1 equals the remainder of eqn. 5:

$$r(x)=r_2(x)*g_1(x)*x^{n-k-s}+r_1(x)*x^{n-k-s} \qquad \text{eqn. 6}$$

Multiplying by $x^{n-k-s}$ corresponds to shifting, and thus, the remainder $r(x)$ can be calculated directly from the remainders $r_1(x)$ and $r_2(x)$ associated with the two factors of the generator polynomial $g(x)$. Further, as discussed below, a user selects different numbers of ECC symbols by selecting to use for encoding a polynomial that includes either or both of the factors $g_1(x)$ and $g_2(x)$. The user can thus select between three polynomials, namely:

$$p_1(x)=g_1(x);$$
$$p_2(x)=g_2(x) \text{ and}$$
$$p_3(x)=g_1(x)*g_2(x)=g(x).$$

with the polynomial $p_1(x)$ producing s ECC symbols, the polynomial $p_2(x)$ producing (n−k)−s ECC symbols and the polynomial $p_3(x)$ producing n−k ECC symbols.

If the generator polynomial $g(x)$ includes additional factors, the user may select various of the factors or combinations thereof as the polynomial $p_s(x)$. In addition, as discussed below with reference to FIG. 2, the factor $g_2(x)$ may itself include a number of factors, and the user may selectively use certain of the factors of $g_2(x)$ to further vary the numbers of ECC symbols included in a code word.

As discussed in more detail below, the code words produced in accordance with the selected polynomials $p_t(x)$ can be decoded in a conventional manner.

B. A Multi-stage Encoder

Referring now to FIG. 1, an encoder 10 for encoding data in accordance with one or both factors of a generator polynomial $g(x)=g_1(x)*g_2(x)$ includes a first stage 12 that selectively divides and multiplies by the factor $g(x)=b_{s-1}x^{s-1}+b_{s-2}x^{s-2}+ \ldots +b_1x+b_0$ and a second stage 30 that divides the symbols supplied thereto by the factor $g_2(x)c_jx^{j-1}+ \ldots +c_1x+c_0$, where j=n−k−s. The encoder may be used to encode the data in accordance with polynomials $p_t(x)$ that include both or either of the factors $g_1(x)$ and $g_2(x)$.

When the polynomial $p(x)=g(x)=g_1(x)*g_2(x)$ is used for encoding, the data symbols are supplied to the first stage 12 over line 14. An adder 20 adds the contents of a first register 18 to the data symbol and supplies the sum over line 22 as part of the quotient $q_1(x)$. With first and second switches, or multiplexers, 16 and 23 in position 1, the adder 20 provides the sum also to Galois Field multipliers 24, which multiply the sum by the coefficients of $g_1(x)$. As shown in the drawing, the first stage includes s–1 Galois Field multipliers, since the coefficient of the largest degree term of $g_1(x)$ is always a one, and thus, the associated multiplier may be omitted.

The respective products are then added in adders 22 to the contents of the associated registers 18, and the registers are updated accordingly. As each data symbol is similarly encoded, a next symbol of the quotient $q_1(x)$ is produced and the registers 18 are further updated. After the last data symbol is encoded, the switch 16 is moved to position 2, and the symbols of the remainder $r_1(x)$ are read out of the registers 18 either in parallel, or serially over line 25. The switches 16 and 23 operate under the control of a controller 27.

As the symbols of the quotient $q_1(x)$ are produced, they are supplied to the second stage 30 of the encoder. The second stage operates in a similar manner to the first stage, to divide the quotient by $g_2(x)$ and produce the remainder $r_2(x)$. The second stage produces the remainder $r_2(x)$ at essentially the same time as the first stage produces the remainder $r_1(x)$.

For the next encoding step, the remainder $r_1(x)$ is held in a processor 40 and the remainder $r_2(x)$ is fed back to the first stage 12 over line 32. The symbols of $r_2(x)$ are supplied to both an adder 28 and, through switch 23, to the Galois Field multipliers 24. The adder 28 adds the symbols of $r_2(x)$ to the contents of the first register 18 and supplies the respective sums to the processor 40 as the symbols of the product $r_2(x)*g_1(x)$. At the same time the Galois Field multipliers multiply the respective remainder symbols by the associated coefficients of $g_1(x)$ and the adders 22 add the products to the contents of the associated registers 18, to update the registers. After all of the symbols of $r_2(x)$ have been supplied to the first stage, the product $r_2(x)*g_1(x)$ is held by the processor 40.

The processor 40 next adds the product $r_2(x)*g_1(x)$ to the remainder $r_1(x)$ and multiplies, that is, shifts, the sum by $x^{n-k-s}$ to produce n–k ECC symbols. The processor then concatenates the ECC symbols with the data symbols that have been similarly shifted by $x^{n-k-s}$, to produce the n-symbol code word. The processor 40 may be replaced by appropriate shift registers and an adder (not shown).

In a second mode, the controller 27 operates the multi-stage encoder 10 to produce s ECC symbols by encoding the data in accordance with only the factor $g_1(x)$. The controller thus essentially by-passes the second stage 30 and the processor 40 includes the remainder $r_1(x)$ in the code word directly as the s ECC symbols.

Alternatively, the controller 27 may operate in a third mode to control the encoder to encode the data in accordance with only the factor $g_2(x)$. The data symbols are thus supplied to the first stage 12 with the switch 16 in position 2 and the switch 23 in the position 1, such that the data symbols are supplied as $q_1(x)$ to the second stage 30. The controller 27 may instead by-pass the first stage entirely, and provide the data symbols directly to the second stage. The second stage then encodes the data symbols in accordance with $g_2(x)$ to produce the remainder $r_2(x)$. The remainder $r_2(x)$ is supplied to the processor 40, which concatenates the remainder to the data as n–k–s ECC symbols.

The encoder 10 may be used to encode data in accordance with a generator polynomial that includes more than two factors by replacing the second stage 30 with first and second sub-stages, which operate in the same manner as the stages 12 and 30 to encode the quotient $q_1(x)$ in accordance with two factors $g_3(x)$ and $g_4(x)$, where $g_2(x)=g_3(x)*g_4(x)$, and so forth.

Figure 2:
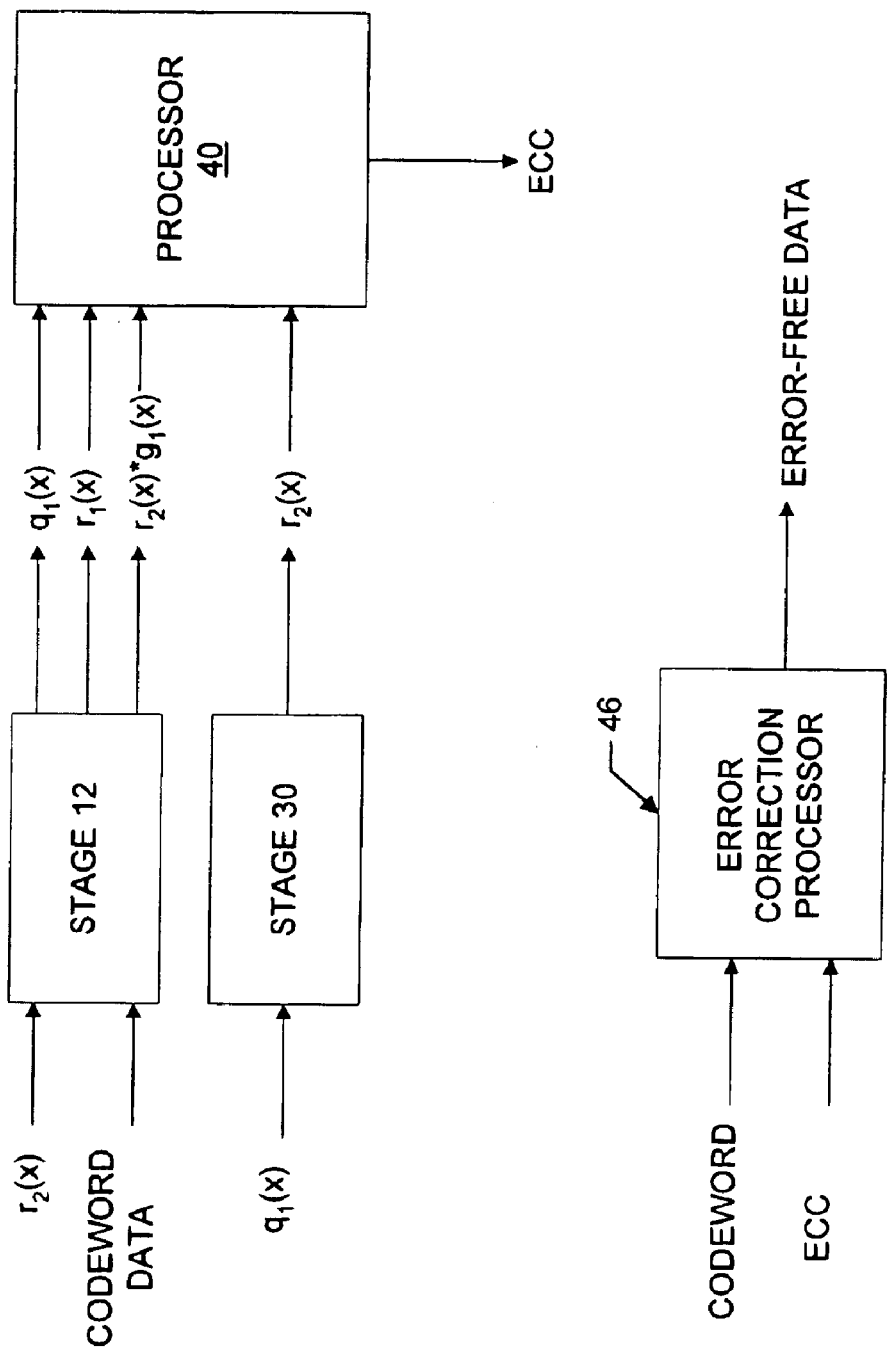
FIG. 2 is a functional block diagram of a decoder for uses with the encoder of FIG. 1.

Referring now to FIG. 2, to decode the code word produced by the encoder 10 of FIG. 1, the system encodes the code word information symbols, that is, the data, using the same polynomial that was used to produce the code word ECC symbols. The system thus uses the first and/or second stages to encode the code word data symbols by $g_1(x)$ and/or $g_2(x)$. The system next, in an error correction processor 46, compares the newly-generated ECC symbols with the ECC symbols included in the code word. If the results indicate that there are errors in the data, the processor 46 operates in a conventional manner to produce error syndromes and, if possible, correct the errors.

Figure 3:
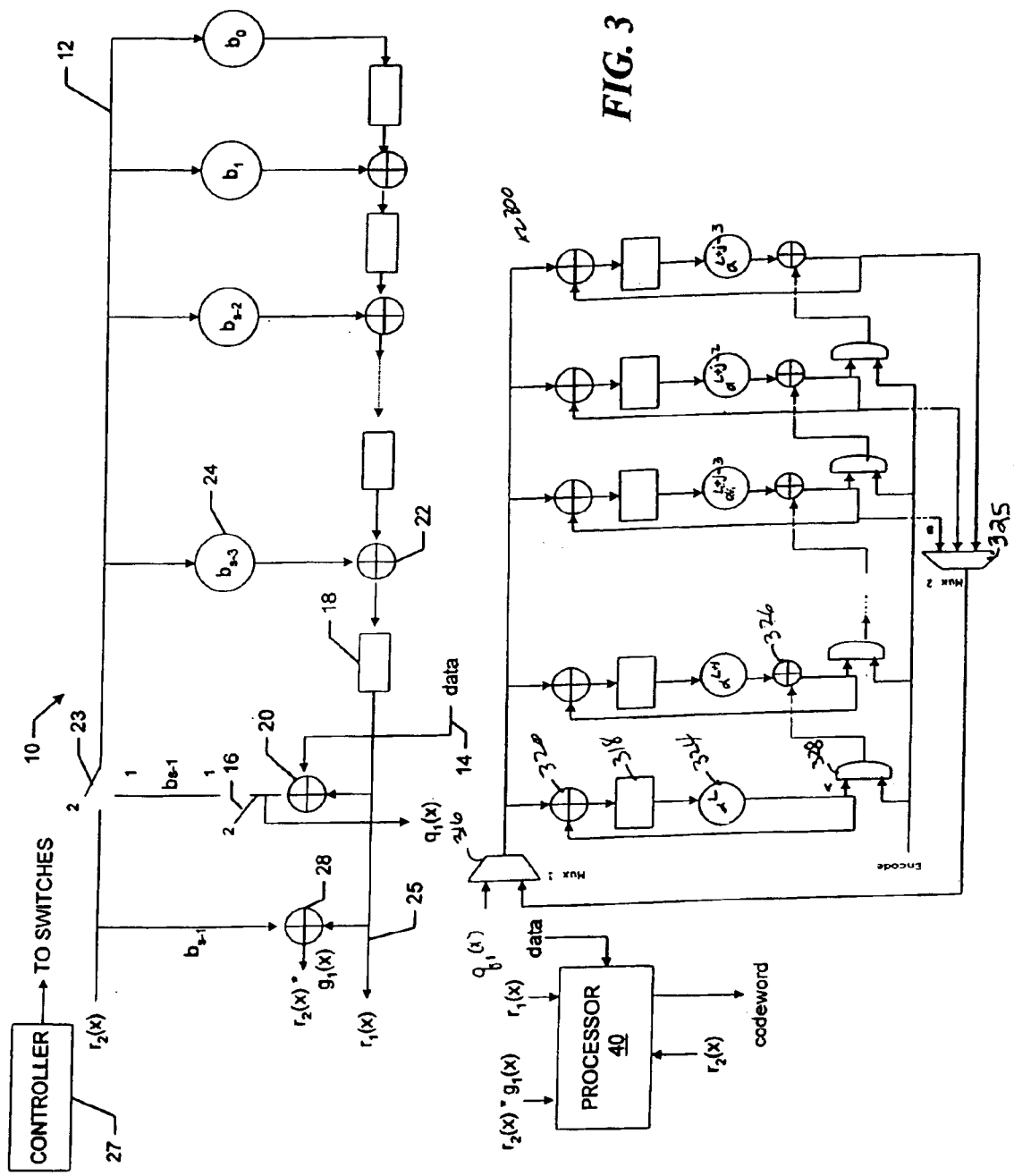
FIG. 3 is a functional block diagram of an alternative encoder.

Referring now to FIG. 3, the second stage 30 of the encoder 10 may be replaced with a modified Fettweis-Hassner encoder/syndrome computation circuit 300. The Fettweis-Hassner circuit includes n–k–s, or j, Galois Field multipliers 324 that multiply the contents of associated registers 318 by the coefficients of the j–1 degree-one factors of $g_2(x)=(x+\alpha^L)(x+\alpha^{L+1})\ldots(x+\alpha^{L+j-1})$. As in a conventional Fettweis-Hassner circuit, a switch or multiplexer 316 is controlled to supply symbols to Galois Field adders 320. In each stage, the adder 320 adds a next symbol to the results of the encoding of a previous symbol and supplies the sum to an associated register 318. The associated Galois Field multiplier 324 then multiplies the contents of the register by $\alpha^i$ and, in all stages except to the first, the Galois Field multiplier supplies the product to an associated feedback adder 326.

The feedback adder 326 adds the product to the value produced in a prior stage of the encoder and supplies the result to a next stage via an associated AND gate 328. In the first stage, the product produced by the Galois Field multiplier 324 is fed back directly to the associated adder 320, and also fed through an associated AND gate 328 to the feedback adder 326 in the second stage. The AND gates link the feedback adders into a chain, and the encoding operation thus includes a latency that is associated with the delay through the chain of adders.

A multiplexer 325 is used to select which stage of the circuit 300 will operate as the last stage of the encoder. For example, the multiplexer may be used to feedback to the multiplexer 316 the results produced by stage j–3, and the circuit 300 encodes by the polynomial $$g_{2i}=(x+\alpha^L)(x+\alpha^{L+1}x)(x-\alpha^{L+j-3})$$

to produce a remainder $r_{2i}(x)$ with j–2 symbols instead of j symbols. The multiplexer 325 may be used to select various other stages and the circuit then produces remainders with various numbers of ECC symbols.

By using the modified Fettweis-Hassner circuit as the second stage of the multi-stage encoder 10, a user can readily encode the data to produce a selected number of ECC symbols associated with $g_1(x)$ and/or one or more factors of $g_2(x)$. Accordingly, the multi-stage encoder with the second stage 300 provides greater flexibility, without increasing the complexity of the encoder. As discussed, the factors $g_1(x)$ and $g_2(x)$ can be selected such that the first, and faster, stage of the encoder produces a relatively large number of ECC symbols, and the delay associated with the second stage 300 is minimized by a relatively short chain of feedback adders.

Figure 4:
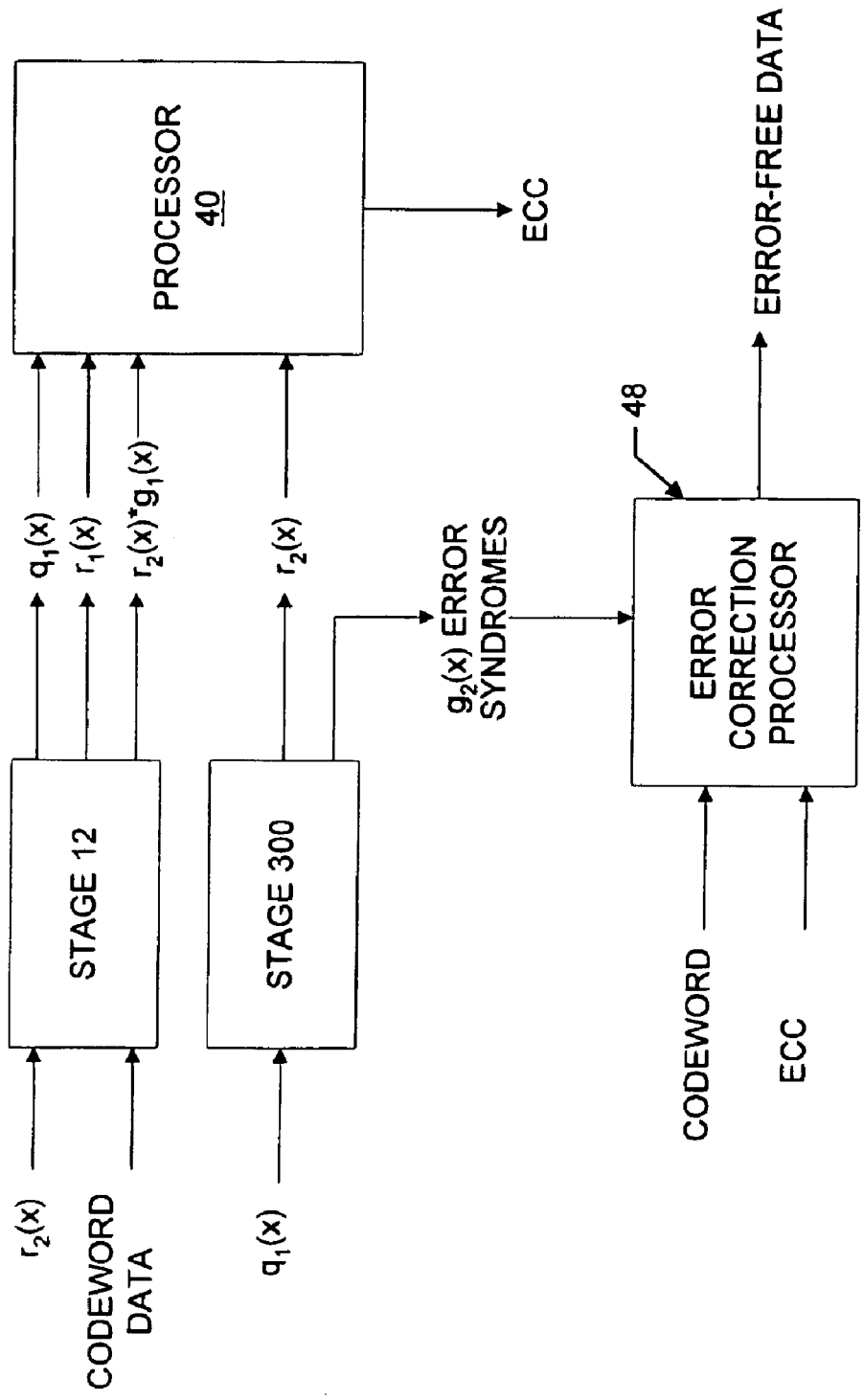
FIG. 4 is a functional block diagram of a decoder for use with the encoder of FIG. 3.

Referring now to FIG. 4, to decode the code word produced using the encoder of FIG. 3 the system again encodes the data in the same manner that the system used to 12 produce the code word ECC symbols. Thus, the system supplies the codeword data symbols to the encoder and produces ECC symbols using the first and/or second stages and 300. An error correction processor 48 then compares the code word ECC symbols and the generated ECC symbols. Thereafter, as necessary, the processor produces the error syndromes associated with $g_1(x)$ in the manner discussed above with reference to FIG. 1.

To produce the error syndromes associated with the selected factors of $g_2(x)$, the system uses the circuit 300. The controller 27 thus controls the AND gates 328 to break the chain of feedback adders 326, such that each stage of the circuit 300 that was used during encoding operates independently to produce an associated error syndrome in a conventional manner. If j−3 stages are used to encode the data, the same stages are also used to produce the syndromes. This can be accomplished by selectively operating the j−3 stages or by operating all of the stages and selecting for further processing only the syndromes produced by the j−3 stages used during encoding.

The error syndromes associated with $g_2(x)$ are then provided to the processor 48, which uses the error syndromes along with those associated with $g_1(x)$ in a conventional manner, to determine error locations in the data and, if possible, correct the errors and produce error-free data.

Certain processors and controllers are shown as separate devices but may be combined. Various switches may be multiplexers or other switching devices. Further, various operations and/or steps thereof may be performed in hardware, software or firmware.

What is claimed is:

1. An error correction code encoder for encoding data in accordance with one or more factors of a generator polynomial $g(x)=g_1(x)*g_2(x)$, the encoder including:
   A. a first stage for selectively multiplying symbols by $g_1(x)$ to produce a product or dividing the symbols by $g_1(x)$ to produce one or both of a quotient $q_1(x)$ and a remainder $r_1(x)$;
   B. a second stage for dividing $q_1(x)$ by the polynomial $g_2(x)$ to produce a remainder $r_2(x)$;
   C. a controller for operating the first and second stages, the controller operating
      a. in a first mode to supply the data to the first stage, the associated quotient $q_1(x)$ to the second stage, the associated remainder $r_2(x)$ produced by the second stage back to the first stage and control the first stage to produce the product $r_2(x)*g_1(x)$;
      b. in a second mode to by-pass the second stage; and
      c. in a third mode to pass the data to the second stage as the quotient $q_1(x)$; and
   D. a processor for producing ECC symbols by manipulating the remainders and products produced by the first and second stages.

2. The encoder of claim 1 wherein the controller operating in the third mode passes the data through the first stage to supply the data to the second stage as the quotient $q_1(x)$.

3. The encoder of claim 1 wherein the second stage includes
   j stages that multiply the symbols by coefficients of degree-one factors of $g_2(x)$; and
   a multiplexer that selectively operates a stage j−i as the last stage, where $0 \leq i < j$.

4. The encoder of claim 1 wherein the second stage encodes in accordance with $g_2(x)g_3(x)*g_4(x)$, the second stage including:
   a first sub-stage for selectively multiplying symbols by $g_3(x)$ to produce a product or dividing the symbols by $g_3(x)$ to produce one or both of a quotient $q_3(x)$ and a remainder $r_3(x)$;
   E. a second sub-stage for dividing $q_3(x)$ by the polynomial $g_4(x)$ to produce a remainder $r_4(x)$;
   F. a controller for operating the first and second sub-stages, the controller operating
      in a first mode to supply the quotient $q_1(x)$ to the first sub-stage, the associated quotient $q_3(x)$ to the second stage, the associated remainder $r_4(x)$ produced by the second sub-stage back to the first sub-stage and control the first sub-stage to produce the product $r_4(x)*g_3(x)$;
      in a second mode to by-pass the second sub-stage; and
      in a third mode to pass the quotient $q_1(x)$ to the second sub-stage as the quotient $q_3(x)$;
   wherein the second stage provides to the processor the remainders and products produced by the first and second sub-stages.

5. The encoder of claim 4 wherein the second stage includes
   j stages that multiply the symbols by coefficients of degree-one factors of $g_2(x)$; and
   a multiplexer that selectively operates a stage j−i as the last stage, where $0 \leq i < j$.

6. An error correction code encoder for encoding data in accordance with one or more factors of a generator polynomial $g(x)=g_1(x)*g_2(x)$, the encoder including:
   A. a first stage for selectively multiplying the symbols by $g_1(x)$ to produce a product or dividing symbols by $g_1(x)$ to produce one or both of a quotient $q_1(x)$ and a remainder $r_1(x)$;
   B. a second stage for dividing $q_1(x)$ by one or more factors of the polynomial $g_2(x)$ to produce a remainder $r_2(x)$;
   C. a controller for operating the first and second stages, the controller operating
      a. in a first mode to supply the data to the first stage, the associated quotient $q_1(x)$ to the second stage, the associated remainder $r_2(x)$ produced by the second stage back to the first stage and control the first stage to produce the product $r_2(x)*g_1(x)$;
      b. in a second mode to by-pass the second stage; and
      c. in a third mode to pass the data to the second stage as the quotient $q_1(x)$; and
   D. a processor for producing ECC symbols by manipulating the remainders and products produced by the first and second stages.

7. A computer generated method for encoding k data symbols in accordance with one or more factors of a generator polynomial $g(x)=g_1(x)*g_2(x)* \ldots *g_7(x)$ of degree n−k, the method including:
   A. using one or more factors of $g(x)$ as a selected polynomial $p(x)$ of degree m, where $1 \leq m \leq n-k$;
   B. dividing the data symbols by a first factor $p_1(x)$ of $p(x)$ to produce one or both of a remainder $r_1(x)$ and a quotient $q_1(x)$, the first factor having degree s;
   C. if $p(x)$ has more factors dividing the quotient $q_1(x)$ by a next factor $p_i(x)$ of the polynomial $p(x)$ to produce a remainder $r_i(x)$;
   D. if $p(x)$ has more factors dividing the quotient $q_i(x)$ by a next factor $p_{i+1}(x)$ to produce a remainder $r_{i+1}(x)$ and/or a quotient $q_{i+1}(x)$;
   E. repeating steps C and D for the remaining factors of $p(x)$; and
   F. manipulating the remainders to produce redundancy symbols that are the ECC symbols for detecting and correcting errors in the k data symbols.

8. The method of claim 7 wherein the step of manipulating the remainders includes the steps of
   multiplying the respective remainders $r_i$ by associated factors $p_t(x)$, for t=1, 2, . . . , i−1;
   adding the results to $r_1(x)$ to produce a remainder sum; and
   shifting the remainder sum by $x^{n-s}$ to produce ECC symbols.

9. The method of claim 8 further including the step of comparing the ECC symbols produced in step F with the ECC symbols of a code word containing the k data symbols and, as necessary, producing error syndromes and correcting errors in the k data symbols to produce error-free data.

10. The method of claim 7 further including the step of producing a data code word by concatenating the ECC symbols to the k data symbols.

11. The method of claim 7 further including the step of comparing the ECC symbols produced in step F with the ECC symbols of a code word containing the k data symbols and, as necessary, producing error syndromes and correcting errors in the data symbols to produce error-free data.

12. A computer generated method for encoding k data symbols in accordance with one or more factors of a generator polynomial $g(x)=g_1(x)*g_2(x)$ of degree n−k, the method including:
- A. selecting $g_1(x)$, $g_2(x)$ or $g_1(x)*g_2(x)$ as a polynomial p(x) of degree m, where $1 \leq m \leq n-k$;
- B. dividing the data symbols by a first factor $p_1(x)$ of p(x) to produce one or both of a remainder $r_1(x)$ and a quotient $q_1(x)$, the first factor having degree s;
- C. if p(x) has a second factor dividing the quotient $q_1(x)$ by a next factor $p_2(x)$ of the polynomial p(x) to produce a remainder $r_2(x)$; and
- D. manipulating the remainders to produce redundancy symbols that are the ECC symbols for detecting and correcting errors in the k data symbols.

13. The method of claim 12 wherein the step of manipulating the remainders includes using $r_1(x)$ as the ECC symbols.

14. The method of claim 13 wherein the step of manipulating the remainders includes the steps of
multiplying $r_2(x)$ by $p_1(x)$ to produce a product,
adding the product to $r_1(x)$ and
shifting the result by $x^{n-s}$.

15. The method of claim 14 further including the step of comparing the ECC symbols produced in step D with the ECC symbols of a code word containing the k data symbols and, as necessary, producing error syndromes and correcting errors in the k data symbols to produce error-free data.

16. The method of claim 13 further including the step of comparing the ECC symbols produced in step D with the ECC symbols of a code word containing the k data symbols and, as necessary, producing error syndromes and correcting errors in the k data symbols to produce error-free data.

17. The method of claim 12 further including the step of producing a data code word by concatenating the ECC symbols to the k data symbols.

18. The method of claim 12 further including the step of comparing the ECC symbols produced in step D with the ECC symbols of a code word containing the k data symbols and, as necessary, producing error syndromes and correcting errors in the k data symbols to produce error-free data.

19. A decoder for decoding a code word that is encoded in accordance with one or more factors of a generator polynomial $g(x)=g_1(x)*g_2(x)$, the decoder including:
- A. a first stage for selectively multiplying the symbols by $g_1(x)$ or dividing symbols by $g_1(x)$ to produce either a remainder $r_1(x)$, a quotient $q_1(x)$ or both the remainder and the quotient;
- B. a second stage for dividing the quotient $q_1(x)$ by the polynomial $g_2(x)$ to produce a remainder $r_2(x)$;
- C. a controller for operating the first and second stages, the controller operating
  - a. in a first mode to supply the data to the first stage, the associated quotient $q_1(x)$ to the second stage, the associated remainder $r_2(x)$ produced by the second stage back to the first stage and control the first stage to produce the product $r_2(x)*g_1(x)$;
  - b. in a second mode to by-pass the second stage; and
  - c. in a third mode to pass the data to the second stage as the quotient $q_1(x)$; and
- D. a processor for producing ECC symbols by manipulating the remainders and products produced by the first and second stages, the processor comparing the ECC symbols with the code word ECC symbols and, as necessary, producing error syndromes and correcting errors in the data to produce error-free data.

20. A decoder for decoding code words encoded in accordance with one or more factors of a generator polynomial $g(x)=g_1(x)*g_2(x)$, the decoder including:
- A. a first stage for selectively dividing symbols by $g_1(x)$ to produce a quotient $q_1(x)$ and/or a remainder $r_1(x)$ or multiplying the symbols by $g_1(x)$ to produce a product;
- B. a second stage for dividing $q_1(x)$ by one or more factors of the polynomial $g_2(x)$ to produce a remainder $r_2(x)$ or producing error syndromes associated with the one or more factors of $g_2(x)$;
- C. a controller for operating the first and second stages, the controller operating
  - a. in a first mode to supply the data to the first stage, the associated quotient $q_1(x)$ to the second stage, the associated remainder $r_2(x)$ produced by the second stage back to the first stage and control the first stage to produce the product $r_2(x)*g_1(x)$;
  - b. in a second mode to by-pass the second stage; and
  - c. in a third mode to pass the data to the second stage as the quotient $q_1(x)$; and
  - d. in a fourth mode to operate the second stage to produce error syndromes associated with the one or more factors of $g_2(x)$; and
- D. a first processor that produces ECC symbols by manipulating the remainders and products produced by the first and second stages; and
- E. a second processor that produces error syndromes associated with $g_1(x)$ and uses the error syndromes produced by the second stage to, as necessary, correct errors in the data and produce error-free data.

* * * * *